US008607106B2

(12) United States Patent
Tseng

(10) Patent No.: US 8,607,106 B2
(45) Date of Patent: Dec. 10, 2013

(54) CHANNEL DETECTION DEVICE

(75) Inventor: Kuan-Jen Tseng, Sinshih Township (TW)

(73) Assignee: Himax Analogic, Inc., Tainan County (TW)

( * ) Notice: Subject to any disclaimer, the term of this patent is extended or adjusted under 35 U.S.C. 154(b) by 387 days.

(21) Appl. No.: 12/911,065

(22) Filed: Oct. 25, 2010

(65) Prior Publication Data

US 2012/0098435 A1 Apr. 26, 2012

(51) Int. Cl.
*G01R 31/28* (2006.01)

(52) U.S. Cl.
USPC .......... 714/724

(58) Field of Classification Search
USPC .......... 714/724; 315/216, 299
See application file for complete search history.

(56) References Cited

U.S. PATENT DOCUMENTS

| | | | | |
|---|---|---|---|---|
| 7,606,679 | B1 * | 10/2009 | Voicu et al. | 702/183 |
| 8,035,314 | B2 * | 10/2011 | Zhao | 315/297 |
| 8,120,274 | B2 * | 2/2012 | Kuo et al. | 315/291 |
| 8,179,059 | B2 * | 5/2012 | Yang et al. | 315/297 |
| 8,334,662 | B2 * | 12/2012 | Jin et al. | 315/299 |
| 2010/0060170 | A1 | 3/2010 | Nair | |

FOREIGN PATENT DOCUMENTS

| | | | |
|---|---|---|---|
| EP | 1006759 | A2 | 6/2000 |
| JP | 2008-258428 | A | 10/2008 |
| TW | 201031934 | A | 9/2010 |

OTHER PUBLICATIONS

English translation of abstract of TW 201031934 A (published Sep. 1, 2010).
English translation of abstract of JP 2008-258428 A (published Oct. 23, 2008).

* cited by examiner

*Primary Examiner* — James C Kerveros
(74) *Attorney, Agent, or Firm* — McClure, Qualey & Rodack, LLP

(57) ABSTRACT

A channel detection device includes a disable circuit, LED pins, receivers and an error detection circuit. The disable circuit sends a disabling pulse to one or some LED pins of the plurality of LED pins, where the one or some LED pins are connected to the disable circuit. Each of the receivers is connected to one of the plurality of LED pins respectively and is capable of outputting an inhibiting signal when the LED pin connected receives the disabling pulse from the disable circuit. The error detection circuit is coupled to the receivers and the LED pins. The error detection circuit is configured to detect open-circuit of some LED pins of the plurality of LED pins, and bypass the detection of open-circuit of some other LED pin of which the receiver outputs the inhibiting signal.

14 Claims, 3 Drawing Sheets

CHANNEL DETECTION DEVICE

BACKGROUND

1. Technical Field

The present disclosure relates to circuitry, and more particularly, detection devices.

2. Description of Related Art

A light-emitting diode (LED) is a semiconductor light source. A flat-panel display uses LED backlighting rather than fluorescent lights used in traditional LCD televisions. The LEDs can come in two forms: dynamic RGB LEDs which are positioned behind the panel, or white Edge-LEDs positioned around the rim of the screen which use a special diffusion panel to spread the light evenly behind the screen.

Usually, there are multiple LED channels adopted in a device. An error detection circuit is required to detect whether some of the channels are open due a breakdown. However, it is possible that in a device some of the channels are left unused. The error detection circuit may fail to determine whether a channel is unused or the channel has a breakdown. Hence there is a need to inform the error detection circuit whether a channel is in use or not in advance.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

According to an embodiment of the present invention, a channel detection circuit includes a disable circuit, LED pins, receivers and an error detection circuit. The disable circuit sends a disabling pulse to one or some LED pins of the plurality of LED pins, where the one or some LED pins are connected to the disable circuit. Each of the receivers is connected to one of the plurality of LED pins respectively and is capable of outputting an inhibiting signal when the LED pin connected receives the disabling pulse from the disable circuit. The error detection circuit is coupled to the receivers and the LED pins. The error detection circuit is configured to detect open-circuit of some LED pins of the plurality of LED pins, and bypass the detection of open-circuit of some other LED pin of which the receiver outputs the inhibiting signal.

According to another embodiment of the present invention, a channel detection circuit includes a disable circuit, LED pins, receivers and an error detection circuit. The disable circuit sends a disabling pulse to at least one of the plurality of LED pins. The receivers are connected to the LED pins respectively, wherein at least one of the receivers is connected to said at least one of the plurality of LED pins for outputting an inhibiting signal when said at least one of the plurality of LED pins receives the disabling pulse from the disable circuit. The error detection circuit is responsive to the inhibiting signal for bypassing detection of an open-circuit of said at least one of the plurality of LED pins and detects the open-circuit of other LED pins.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
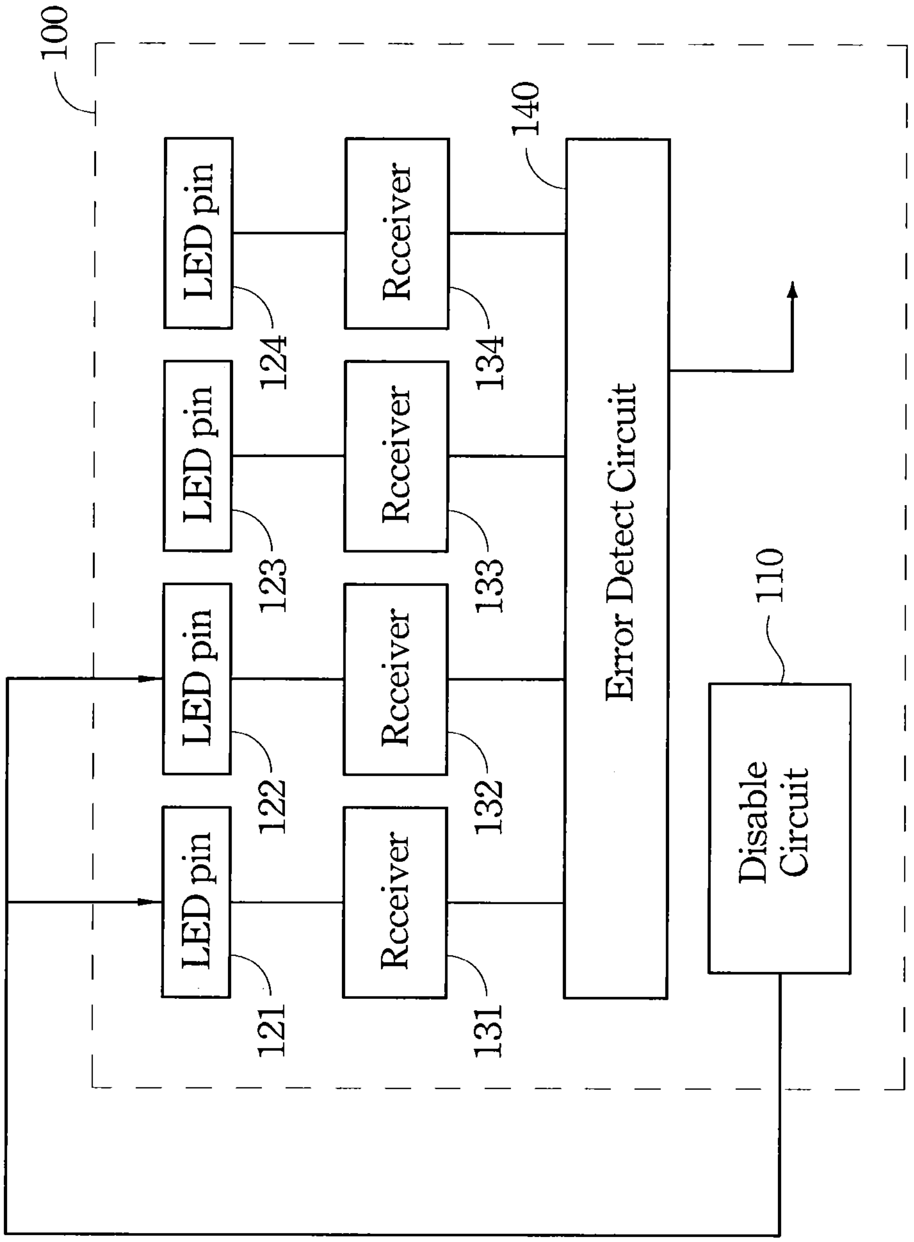
FIG. 1 is a block diagram of a channel detection device according to one embodiment of the present invention.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of “a”, “an”, and “the” includes reference to the plural unless the context clearly dictates otherwise. Also, as used in the description herein and throughout the claims that follow, the terms “comprise or comprising”, “include or including”, “have or having”, “contain or containing” and the like are to be understood to be open-ended, i.e., to mean including but not limited to. As used in the description herein and throughout the claims that follow, the meaning of “in” includes “in” and “on” unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term “and/or” includes any and all combinations of one or more of the associated listed items.

It will be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one or more various aspects, the present disclosure is directed to a channel detection device. The channel detection device may be easily adapted to existing LED drivers, and may be applicable or readily adaptable to all technology.

In practice, the channel detection device may be integrated into the LED driver; alternatively, the channel detection device may be an external device that is electrically connected to the LED driver. Those with ordinary skill in the art may flexibly configure the channel detection device depending on the desired application.

FIG. 1 is a block diagram of a channel detection device 100 according to one embodiment of the present invention. As shown in FIG. 1, a channel detection device 100 includes a disable circuit 110, LED pins 121, 122, 123 and 124, receivers 131, 132, 133 and 134 and an error detection circuit 140. The LED pins 121, 122, 123 and 124 are configured to connect to the LED channels, and to the receivers 131, 132, 133 and 134 respectively. The receivers 131, 132, 133 and 134 are connected to the error detection circuit 140.

In this embodiment, the LED pins 121 and 122 are left open by design, not connected to LED channels, while the LED pins 123 and 124 are connected to the LED channels and expected to function normally. The LED pins 121 and 122 are hence electrically connected to the disable circuit 110 while the LED pins 123 and 124 are not.

According to the present invention, the disable circuit 110 is configured to generate a disabling pulse and send it to the LED pin which is not in use and then to inform the receiver coupled to the unused LED pin. For example, in the embodiment illustrated in FIG. 1, the disable circuit 110 generates and sends out disabling pulse to the LED pins 121 and 122. The receivers 131 and 132 then are informed by the disabling pulse that the LED pins 121 and 122 are not coupled to any LED channels. The receivers 131 and 132 hence output inhibiting signals to the error detection circuit 140. By these inhibiting signals, the error detection circuit 140 is informed to ignore whether the LED pins 121 and 122 are opened or unused. The error detection circuit 140 is configured to detect whether any LED channels are opened due any breakdown. The error detection circuit 140 then may bypass the detection results related to the LED pins 121 and/or 122. On the other hand, the error detection circuit 140 may determine whether each of the LED pins 123 and 124 is functioning normally or opened due a breakdown in the LED channel connected.

Thus, the error detection circuit 140 detects open-circuit of the LED pins that are connected to the LED channels in use but not the LED pins that are not connected to the LED channels.

Figure 2:
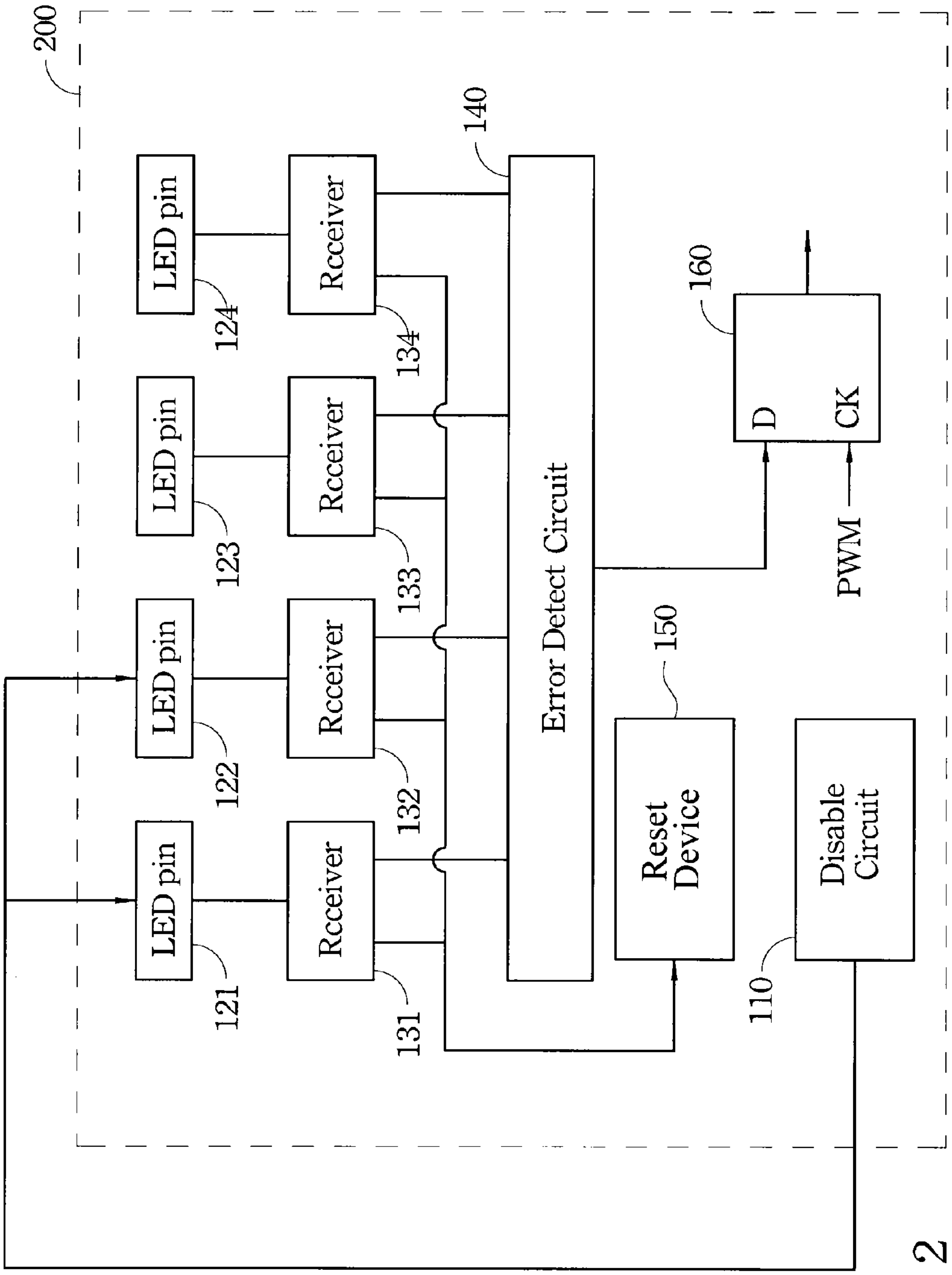
FIG. 2 is a block diagram of a channel detection device according to another embodiment of the present invention.

FIG. 2 is a block diagram of a channel detection device 200 according to another embodiment of the present invention. As shown in FIG. 2, a channel detection device 200 further includes a reset device 150 and a D flip-flop 160. The reset device 150 is connected to the receivers 131, 132, 133 and 134. The D flip-flop 160 is connected to the error detection circuit 140.

For the case that some of the LED channels are not in use by design, for example, the LED pins 121 and 122 are not connected to any LEDs as shown in FIG. 2, after the disable circuit 110 sending out the disabling pulse, the reset device 150 may send a reset pulse to all receivers, or only the receivers that have received disabling pulse, that is, the receivers 131 and 132 in the example illustrated in FIG. 2. By the reset mechanism provided above, the receivers 131 and 132 may output an activate signal to the error detection circuit 140, and the error detection circuit 140 is reactivated to include the detection of the open-circuit of all the LED pins.

The error detection circuit 140 may output detection result of whether the LED pins are opened. For the LED driver, a PWM signal is used for adjusting the luminance of LEDs. In this embodiment, the D flip-flop 160 is configured to receive the detection result and the PWM signal to take on a logic state of the detection result at the moment of a positive edge of the PWM signal.

Figure 3:
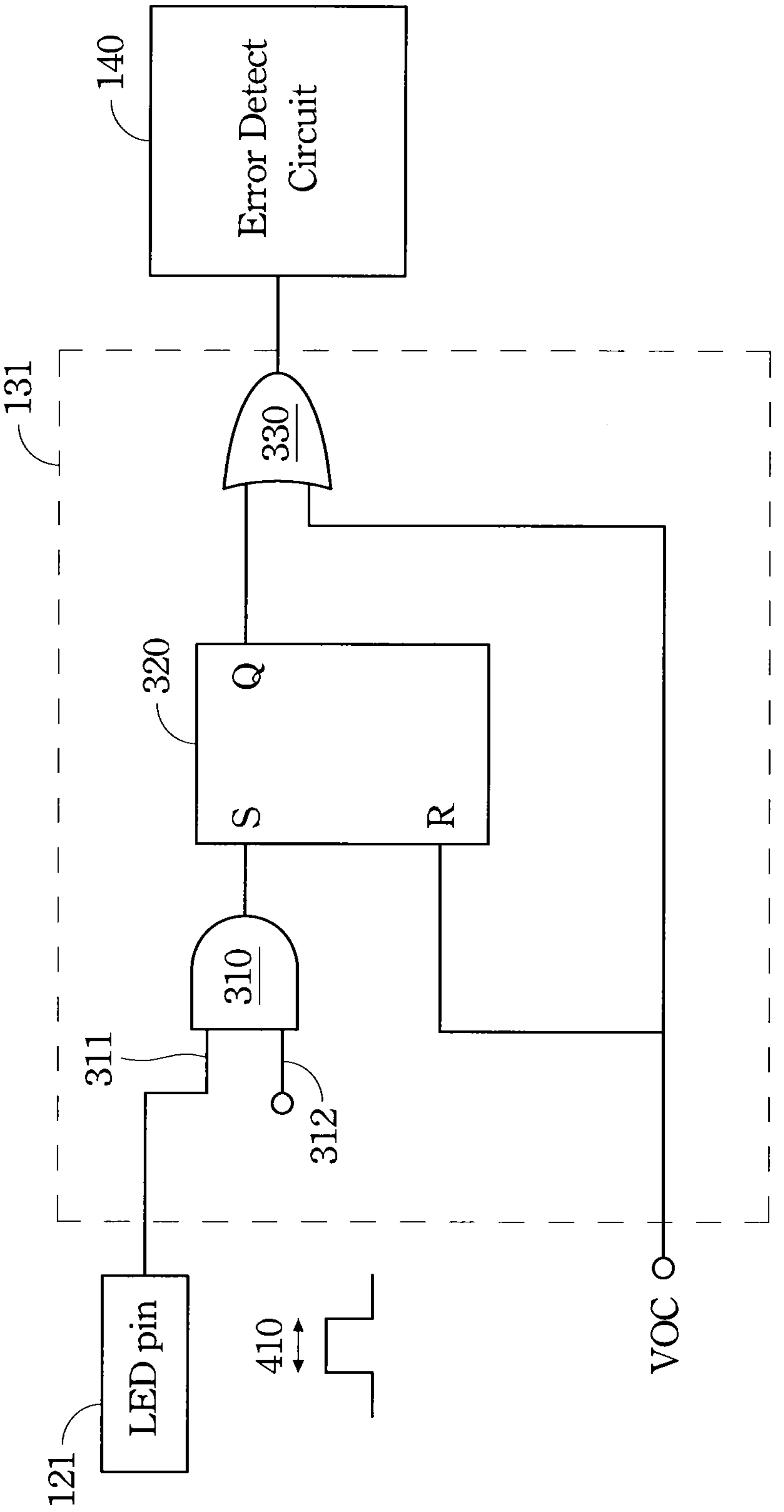
FIG. 3 is a circuit diagram of a receiver of FIG. 2.

FIG. 3 is a circuit diagram of the receiver 131. In one or more embodiment, one or each of the receivers 132, 133 and 134 may be structurally the same as the receiver 131.

The receiver 131 includes an AND gate 310, a SR flip-flop 320 and an OR gate 330. The AND gate 310 has a first input 311 and a second input 312, where the first input 311 is connected to the LED pin 121. The SR flip-flop 320 has a set input S, a reset input R and an output Q, where the set input S is connected to the output of the AND gate 310, and the reset input R is connected to the reset device 150. The OR gate 330 has two inputs respectively connected to the output Q of the SR flip-flop 320 and the reset device 150.

During a startup time 410 (as demonstrated in FIG. 3) of the LED driver, the second input 312 is in a logic high state while the disabling pulse is sent to the LED pin 121, so that the OR gate 330 is configured to output the inhibiting signal to the error detection circuit 140.

After the disabling pulse generated, when the LED pin 121 is then connected to a LED, the reset device 150 measures that a voltage across the LED is higher than about some potential, say, 0.2 V, and then sends the reset pulse to the reset input R of the SR flip-flop 320, so that the OR gate 330 may output the activate signal to the error detection circuit 140 when the reset input R of the SR flip-flop 320 receives the reset pulse. Therefore, the error detection circuit 140 then begins to include the detection of the open-circuit of the LED pin 121.

On the contrary, after the disabling pulse generated, if the LED pin 121 is still not in use, the reset device 150 measures that a voltage at the LED pins 121 is lower than the potential, say, 0.2 V, and doesn't send any reset pulse to the reset input R of the SR flip-flop 320. Therefore, the error detection circuit 140 ignores whether the LED pins 121 and 122 are opened due breakdown or are unused.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A channel detection device comprising:

a plurality of LED pins;

a disable circuit for sending a disabling pulse to a first part of the plurality of LED pins, the plurality of LED pins being connected to the disable circuit;

a plurality of receivers, each of which connected to one of the plurality of LED pins respectively, each of the receivers being capable of outputting an inhibiting signal when the LED pin connected receives the disabling pulse from the disable circuit; and an error detection circuit coupled to the receivers and the LED pins, the error detection circuit configured to detect open-circuit of a second part of the plurality of LED pins other than the first part of the plurality of LED pins, and bypass the detection of open-circuit of the first part of the plurality of LED pins of which the corresponding receiver outputs the inhibiting signal.

2. The channel detection device of claim 1, further comprising:

a reset device for sending a reset pulse to one or some of the plurality of receivers, such that the one or some of the receivers outputs an activate signal to the error detection circuit to reactivate the error detection circuit to detect open-circuit of one or some of the LED pins that are connected to the one or some of the receivers.

3. The channel detection device of claim 2, wherein the receiver comprises:

an AND gate having a first input connected to the LED pin and a second input;

a SR flip-flop having a set input connected to the output of the AND gate and a reset input connected to the reset device;

an OR gate having two inputs respectively connected to the output of the SR flip-flop and the reset device.

4. The channel detection device of claim 3, wherein the second input is in a logic high state while the disabling pulse is sent to the LED pin, so that the OR gate is configured to output the inhibiting signal to the error detection circuit.

5. The channel detection device of claim 3, wherein the OR gate is configured to output the activate signal to the error detection circuit when the reset input receives the reset pulse.

6. The channel detection device of claim 2, wherein the error detection circuit outputs detection result according to whether the one or some LED pin is opened.

7. The channel detection device of claim 6, further comprising:

a D flip-flop for receiving the detection data and a PWM signal to take on a logic state of the detection result at the moment of a positive edge of the PWM signal.

8. A channel detection device comprising:

a plurality of LED pins;

a disable circuit for sending a disabling pulse to a first part of the plurality of LED pins;

a plurality of receivers connected to the LED pins respectively, wherein at least one of the receivers is connected to said at least one of the plurality of LED pins for outputting an inhibiting signal when said at least one of the plurality of LED pins receives the disabling pulse from the disable circuit; and an error detection circuit responsive to the inhibiting signal for bypassing detection of an open-circuit of the first part of the plurality of LED pins and for detecting the open-circuit of a second part of the plurality of LED pins other than the first part of the plurality of LED pins.

9. The channel detection device of claim 8, further comprising:

a reset device for sending a reset pulse to said at least one of the receivers, such that said at least one of the receivers outputs an activate signal to the error detection circuit to reactivate the error detection circuit to detect the open-circuit of said at least one of the plurality of LED pins.

10. The channel detection device of claim 9, wherein the receiver comprises:

an AND gate having a first input connected to the LED pin and a second input;

a SR flip-flop having a set input connected to the output of the AND gate and a reset input connected to the reset device;

an OR gate having two inputs respectively connected to the output of the SR flip-flop and the reset device.

11. The channel detection device of claim 10, wherein the second input is in a logic high state while the disabling pulse is sent to the LED pin, so that the OR gate is configured to output the inhibiting signal to the error detection circuit.

12. The channel detection device of claim 10, wherein the OR gate is configured to output the activate signal to the error detection circuit when the reset input receives the reset pulse.

13. The channel detection device of claim 9, wherein the error detection circuit outputs detection result according to whether one or more of the LED pins is opened.

14. The channel detection device of claim 13, further comprising: a D flip-flop for receiving the detection data and a PWM signal to take on a logic state of the detection result at the moment of a positive edge of the PWM signal.

* * * * *